Figure 1:
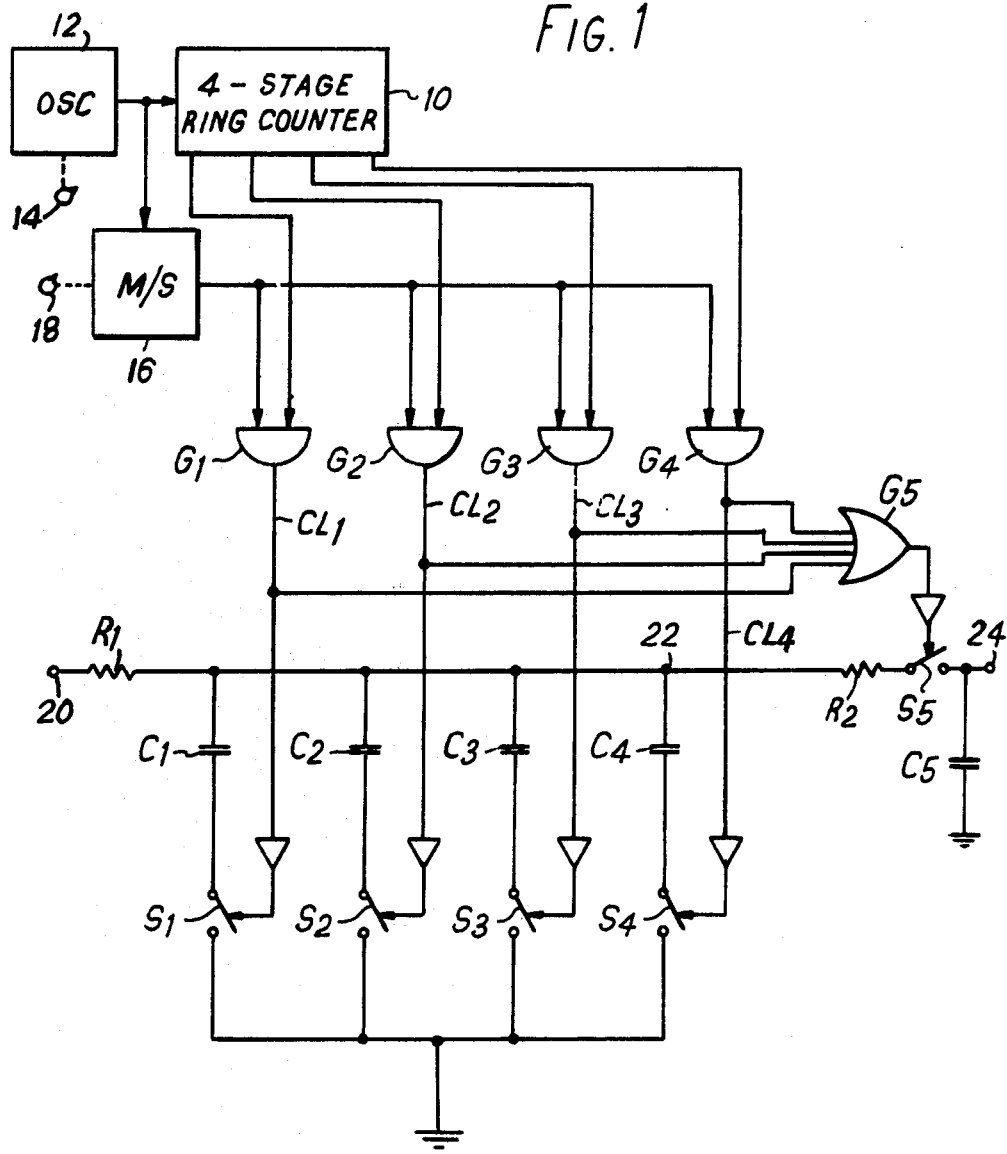

United States Patent [19]

Woollvin et al.

[11] 4,151,474
[45] Apr. 24, 1979

[54] VARIABLE BANDWIDTH PASS-BAND FILTER

[75] Inventors: Geoffrey G. Woollvin, Hertfordshire; Mieczyslaw Bilogan, Essex, both of England

[73] Assignee: Raytheon Company, Lexington, Mass.

[21] Appl. No.: 825,767

[22] Filed: Aug. 18, 1977

[30] Foreign Application Priority Data

Aug. 20, 1976 [GB] United Kingdom ............... 34855/76

[51] Int. Cl.² ............................................. H03H 7/12
[52] U.S. Cl. .................................... 328/167; 333/173
[58] Field of Search ...................... 328/167; 333/70 A

[56] References Cited

U.S. PATENT DOCUMENTS

| 3,603,898 | 9/1971 | Dawson | 328/167 X |
| 3,604,947 | 9/1971 | Puthuff | 328/167 X |
| 3,740,537 | 6/1973 | Giles et al. | 328/167 X |
| 3,890,577 | 6/1975 | Grundy | 328/167 X |

Primary Examiner—John S. Heyman
Attorney, Agent, or Firm—M. D. Bartlett; J. D. Pannone; H. W. Arnold

[57] ABSTRACT

In a switched multipath filter network, the passband is varied by varying the duty cycle of the switches which commutate the constituent filters. When no filter is operative, the output connection of the filters is interrupted to prevent the unfiltered signal passing through, but the network output is smoothed to provide sample and hold action.

5 Claims, 2 Drawing Figures

VARIABLE BANDWIDTH PASS-BAND FILTER

BACKGROUND TO THE INVENTION AND PRIOR ART

The present invention relates to a switched multipath filter network which is defined herein as a filter network with a plurality of low-pass filters operating in parallel under the control of cyclically operated switches such that the network has the characteristics of a band-pass filter with its pass-band centered on a frequency which is determined by the frequency of the switch operating cycle.

In some applications of such filter networks, it is desirable to be able to select different pass-bands. There is no difficulty in changing the pass-band centre frequency; this is done by changing the frequency of the switch operating cycle. However, it may also be desirable to be able to change the bandwidth, e.g., in use in a two-tone frequency shift keyed system, and it is with this problem that the present invention is concerned. Before explaining the invention, the general background thereto will be briefly outlined.

It is difficult to design passive or active band-pass filters which have both a stable centre frequency and a high Q, such as Q=50. It is known, however, that a band-pass filter may be formed by operating a plurality of low-pass filters in parallel, each filter being preceded by and followed by modulators which are driven by modulating signals at the desired centre frequency and such that the input signal is converted down to the difference frequency, low-pass filtered and then converted back to the original frequency. The modulating signals form an N-phase system (N being the number of filter paths), and the outputs of these paths are additive and such that the output is filtered in accordance with a pass-band extending from $f_s-f_c$ to $f_s+f_c$, where $f_s$ is the modulating signal frequency and $f_c$ is the cut-off frequency of each low-pass filter.

In practice, an arrangement of this nature is rarely employed because of its expense, but it is known that the modulating signal need not be a sinusoid at $f_s$ but may be a square wave at $f_s$ and this leads to simplified arrangements, which are employed, in which the modulators are replaced by switches controlled by the square waves of different phases, which may now be better referred to as sampling signals; each filter performs a sampling function. There may be, by analogy with the network having modulators, series switches preceding and following each low-pass filter, but it is known that other arrangements of switches are feasible, e.g., switches in the shunt arms of the low-pass filters. In any event, the use of the switches does more than replace the function of the modulators. The sampling action causes each filter to be operative for a limited duty cycle which has the same effect as if some component values were modified and the network typically has a main pass-band extending from $f_s-f_c/N$ to $f_s+f_c/N$. The bandwidth has been reduced by a factor of N from $2f_c$ to $2f_c/N$ and this assists in achieving a narrow pass-band, which is centred on the frequency $f_s$ which can be accurately determined by the square-wave generator which provides the sampling signals. The factor of N presupposes that the duty cycle is 1/N, that is to say, the switches are operated without either overlaps or gaps. As well as the main pass-band, there is a series of harmonic bands $nf_s \pm f_c/N$ where n is the order of the harmonic. The values of n which are present depends on the number of paths. With N=4, for example, the second and third harmonics (n=2 and n=3) are present, but the fourth harmonic is absent. Regardless of which harmonic bands are present, it is a simple matter to reject them all by a low-pass filter with a cut-off frequency in the stop band between the main pass-band and the first harmonic band which is present.

THE INVENTION

The present invention is based upon an appreciation that the dividing factor determining the width of the main pass-band need not necessarily be N. If this factor could be some other variable quantity M, the duty cycle effect could give control over a variable bandwidth of $2f_c/M$. However, if M is made other than N, there exist either overlaps or gaps between the switch operations and these give rise to problems which depend upon the way in which the switches are arranged, as will be explained below.

Thus, the present invention may be practised with a switched multipath filter network as hereinbefore defined provided with means for varying the duty cycles of the switches in a range not exceeding 1/N. The low-pass filters are of such a form as to provide a purely resistive path from the input to the output of the filter network when no low-pass filter is operating. Switching means are controlled synchronously with the cylically operated switches to interrupt the connection of the filters to the output of the filter network when no low-pass filter is operating, and a smoothing circuit is connected to the output of the filter network.

The smoothing network may be the low-pass filter which rejects the harmonic bands. The mode of operation will now explained as will as preferred form of network which provides 2nd order Butterworth low-pass filters in an economical configuration.

Figure 2:
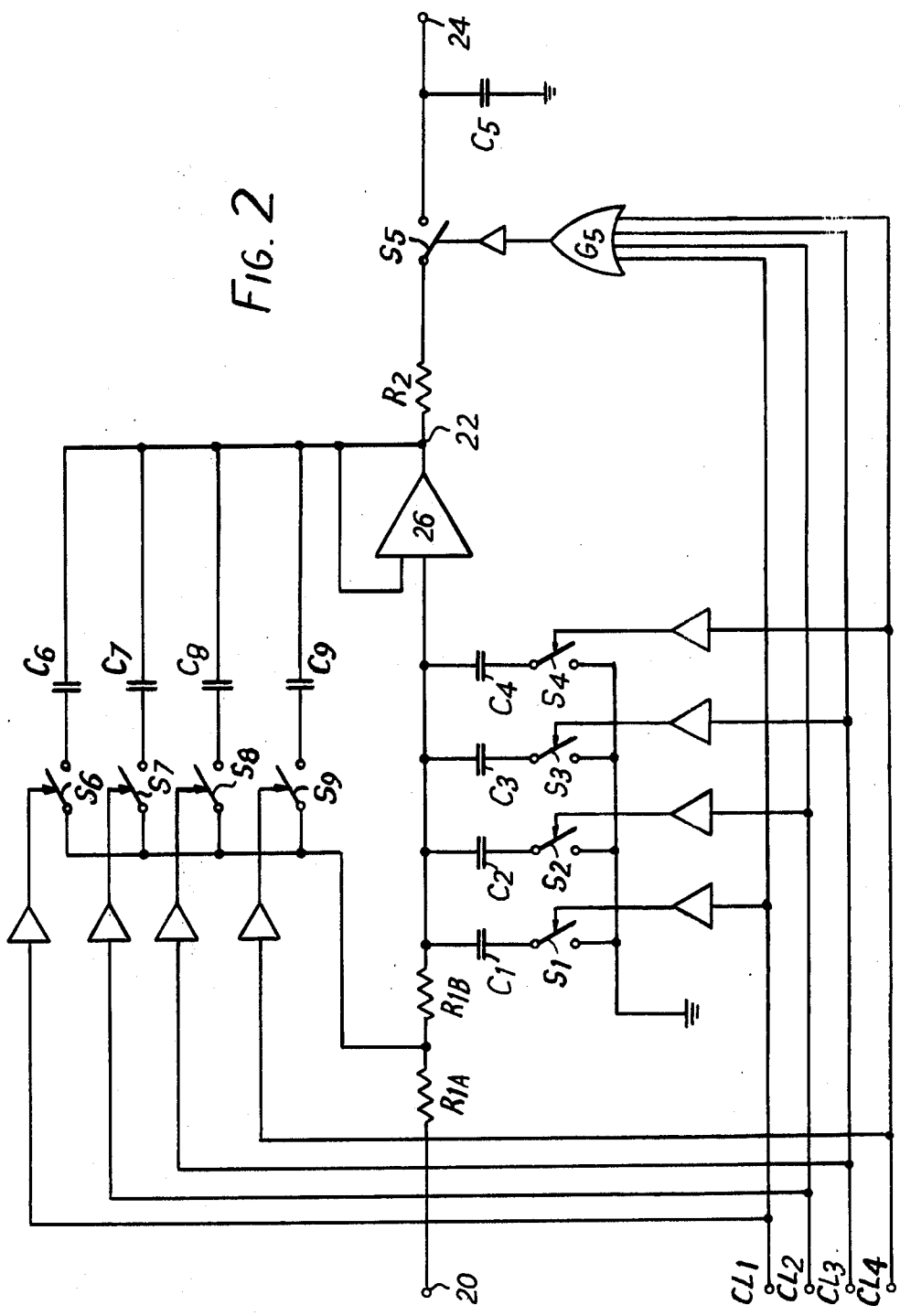

Reference is made to the drawings which show, by way of example, a simple embodiment of the invention including the filter network and control means therefor (FIG. 1) and the preferred form of the filter network (FIG. 2).

Referring to FIG. 1, a filter network comprises four simple RC low-pass filters operating in cyclic sequence in parallel with one another, but sharing a common resistor $R_1$. The shunt arms of the filters are capacitors $C_1$ to $C_4$ which are connected in circuit in cyclic sequence by means of electronic switches $S_1$ to $S_4$, represented purely schematically as make and break contacts operated by a driver. (In practice, the driver will control an electronic device, e.g., a FET). The switches are controlled by sampling signals on clock lines $CL_1$ to $CL_4$. These signals are a 4-phase system of square waves so that the switches $S_1$ to $S_4$ close in cyclic sequence. If the square waves have a duty cycle of ¼, each switch re-opens exactly as the next closes so that there are neither overlaps nor gaps in the operation of the filters. A filter network as so far described is well known, but does not have the facility of varying the bandwidth.

In performing the present invention, the duty cycle is made variable and to this end the sampling signals are provided by four AND gates $G_1$ to $G_4$ fed with the respective outputs of a 4-stage ring counter 10 which is driven by an oscillator 12 running at $4f_s$ where $f_s$ is the sampling frequency, (frequency of each square wave). A knob 14 symbolically represents the facility of adjusting the oscillator frequency in accordance with the desired pass-band centre frequency. The duty cycle is varied, in the range below ¼, for example over the decade range 1/40 to ¼, by applying the output of a monostable flip-flop 16 to the second inputs of all the gates $G_1$ to $G_4$. The monostable flip-flop is triggered by the oscillator 12 and its delay is variable to vary the duty cycle, as represented by a knob 18.

It will be noted that the duty cycle cannot be increased beyond ¼. This is a necessary limitation in that any overlap of closure of the switches $S_1$ to $S_4$ would short together pairs of the capacitors $C_1$ to $C_4$. However, it is permissible to reduce the duty cycle below ¼ without affecting the process in principle but with the result of changing the pass-band. Each low-pass filter has a cut-off frequency $f_c$ determined by $R_1$ and $C_1$ ($=C_2=C_3=C_4$). Considering $R_1$ in relation to any one low-pass filter, $R_1$ is in circuit $1/M$ of the time, where $1/M$ is the duty cycle, and open circuit $(M-1)/M$ of the time and is therefore equivalent to a resistor of $M$ times it value connected all the time. Therefore, the main pass-band of the filter network does not extend over $f_s \pm f_c$ but over $f_s \pm f_c/M$ and the bandwidth can be varied by varying $M$.

If $1/M$ is less than ¼, there are gaps between operation of the filters, i.e., intervals in which none of the switches $S_1$ to $S_4$ is closed. During such intervals, the capacitors are effectively non-existent and there is nothing more than a direct resistive connection through $R_1$ from the input terminal 20 to an output node 22. Therefore, in these intervals or gaps, the unfiltered signal would pass through. This problem is overcome by the provision of a further switch $S_5$ between the node 22 and the network output terminal 24, which switch is closed only when any one of the switches $S_1$ to $S_4$ is closed. To this end $S_5$ is controlled by the output of an OR gate $G_5$ with four inputs connected to the clock lines $CL_1$ to $CL_4$.

In order to provide sample and hold action (which fills in the gaps when $S_5$ is open), a smoothing capacitor $C_5$ is connected to the output terminal 24. This capacitor acts in conjunction with a series resistor $R_2$ to form a low-pass filter rejecting harmonic pass-bands.

FIG. 2 shows a preferred filter network in which each low-pass filter is an active 2nd order Butterworth filter of a configuration known per se and which will be described for just the first filter. This comprises $R_1$ and $C_1$, as in FIG. 1, but with $R_1$ split into $R_{1A}$ and $R_{1B}$ and the junction between the latter connected through $C_6$ to the inverting input of an operational amplifier 26. $C_1$ is connected to the non-inverting input and the output of the amplifier is connected back to the inverting input. The other filters have capacitors $C_7$ to $C_9$ corresponding to $C_6$ and the amplifier, like $R_{1A}$ and $R_{1B}$, is shared by all filters.

It is necessary to place switches $S_6$ to $S_9$ in series with $C_6$ to $C_9$, operating $S_6$ to $S_9$ synchronously with $S_1$ to $S_4$, in order to prevent charge re-distribution between $C_1$ and $C_6$ when $S_1$ is open, and so on. With the provision of $S_6$ to $S_9$, it can be seen that, when none of $S_1$ to $S_4$ and none of $S_6$ to $S_9$ is closed, there is a purely resistive connection from input terminal 20 to node 22, through $R_{1A}$, $R_{1B}$ and the amplifier 26. As in FIG. 1, the switch $S_5$ eliminates the unfiltered signal which would pass through during the gaps in operation of the filters. It is immaterial whether $S_6$ to $S_9$ precede or follow $C_6$ to $C_9$.

The advantages of the preferred embodiment of FIG. 2 are as follows:

(1) Pass-band centre frequency is accurately determined by the oscillator 12.

(2) Pass-bandwidth is readily variable by controlling the duty cycle.

(3) High Q values can be achieved (the basic low-pass filter configuration being 2nd order Butterworth).

(4) Insertion loss and skirt selectivity are not materially influenced by varying the bandwidth.

(5) The foregoing advantages are achieved with extreme economy of components.

Although the described embodiment utilizes a monostable circuit 16 to determine the duty cycle, this function may be achieved in various other ways. For example, the oscillator 12 could be a higher frequency oscillator driving the counter 10 through a frequency divider. The pulses from the oscillator could be fed to another counting arrangement which would feed the variable duty cycle pulses to the gates $G1$ to $G4$.

In the described embodiment, the pulses on the lines $CL_1$ to $CL_3$ are combined by an OR-gate $G_5$, but it may be preferred to utilize a commutating arrangement, or to take the waveform for operating the switch $S_5$ from the input side of the gates $G1$ to $G4$.

Embodiments have been described with simple RC filters and active Butterworth filters. The invention is not restricted in its application to any particular type of filter but is particularly useful with active filters such as Butterworth and Bessel filters.

What is claimed is:

1. In a switched multipath variable pass-band filter network comprising a plurality N of low pass filters operating in parallel under the control of cyclically operated switches such that the network has the characteristics of a bandpass filter with its pass-band centered on a frequency which is determined by the frequency of the switch operating cycle, the improvement comprising variable pulse width generating and logic gating means for varying the duty cycles of the switches in a range not exceeding 1/N, the low pass filters providing a purely resistive path from the input to the output of the filter network when no low pass filter is operating, switching means controlled synchronously with the cyclically operated switches to interrupt the connection of the filters to the output of the filter network when no low pass filter is operating, and a smoothing circuit connected to the output of the filter network.

2. The invention according to claim 1, wherein the smoothing circuit is a low-pass filter with a cut-off frequency such as to reject signals in harmonic passbands.

3. The invention according to claim 1, wherein the low-pass filters comprise a common series resistance and individual capacitative shunt arms which are connected to a reference potential when the corresponding switches are operated.

4. In a switched multipath variable pass-band filter network comprising a plurality N of low pass filters operating in parallel under the control of cyclically operated switches such that the network has the characteristics of a bandpass filter with its pass-band centered on a frequency which is determined by the frequency of the switch operating cycle, the improvement comprising means for varying the duty cycles of the switches in a range not exceeding 1/N, the low pass filters providing a purely resistive path from the input to the output of the filter network when no low pass filter is operating, switching means controlled synchronously with the cyclically operated switches to interrupt the connection of the filters to the output of the filter network when no low pass filter is operating, a smoothing circuit connected to the output of the filter network, said low pass filters comprising common series resistance and individual capacitative shunt arms connected to a reference potential when the corresponding switches are operated, and a tap in said series resistance connected through a plurality of capacitative arms, which are in one to one correspondence with the said shunt arms, to the output of an operational amplifier having differential inputs connected respectively to the said output and to the junction between the series resistance and the said shunt arms, each said capacitative arm including a further switch which is closed when the corresponding one of the said cyclically operated switches is closed.

5. The invention according to claim 1, wherein the said cyclically operating switches are operated by cyclic pulses in a corresponding plurality of clock lines, the said switching means being operated by a waveform derived by combining the signals on all the clock lines.

* * * * *